United States Patent
Park

(10) Patent No.: US 10,050,633 B2
(45) Date of Patent: Aug. 14, 2018

(54) CLOCK GENERATION CIRCUIT, AND SEMICONDUCTOR DEVICE AND SYSTEM USING THE SAME

(71) Applicant: SK hynix Inc., Icheon-si, Gyeonggi-do (KR)

(72) Inventor: Myeong Jae Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/486,975

(22) Filed: Apr. 13, 2017

(65) Prior Publication Data
US 2018/0123600 A1  May 3, 2018

(30) Foreign Application Priority Data

Oct. 31, 2016 (KR) .................. 10-2016-0143199

(51) Int. Cl.
*G11C 7/22* (2006.01)
*H03L 7/081* (2006.01)
*H03K 5/151* (2006.01)

(52) U.S. Cl.
CPC ........... *H03L 7/0812* (2013.01); *H03K 5/151* (2013.01); *G11C 7/222* (2013.01)

(58) Field of Classification Search
CPC ..... G11C 7/1072; G11C 7/222; G11C 29/023; G11C 29/12015; G11C 29/56012
See application file for complete search history.

(56) References Cited

U.S. PATENT DOCUMENTS

| 2009/0146706 | A1* | 6/2009 | You | H03K 5/1565 |
| | | | | 327/158 |
| 2011/0025381 | A1* | 2/2011 | Yamahira | G06F 1/06 |
| | | | | 327/115 |
| 2012/0262212 | A1* | 10/2012 | Lin | H03K 5/15013 |
| | | | | 327/245 |
| 2013/0214826 | A1 | 8/2013 | Dahan et al. | |
| 2014/0056085 | A1* | 2/2014 | Kang | H03L 7/0802 |
| | | | | 365/191 |
| 2014/0145764 | A1* | 5/2014 | Lee | H03K 5/15066 |
| | | | | 327/142 |

FOREIGN PATENT DOCUMENTS

KR   1020020056258 A   7/2002

* cited by examiner

*Primary Examiner* — Khamdan Alrobaie
(74) *Attorney, Agent, or Firm* — William Park & Associates Ltd.

(57) ABSTRACT

A clock generation circuit may include a first clock generator and a second clock generator. The first clock generator may generate a first output clock toggling in synchronization with a rising edge of a first input clock. The second clock generator may generate a second output clock based on a second input clock and the first output clock. The second output clock may have a level changing based on the first output clock, and may be generated at a rising edge of the second input clock.

19 Claims, 4 Drawing Sheets

CLOCK GENERATION CIRCUIT, AND SEMICONDUCTOR DEVICE AND SYSTEM USING THE SAME

CROSS-REFERENCES TO RELATED APPLICATION

The present application claims priority under 35 U.S.C. § 119(a) to Korean application number 10-2016-0143199 filed on Oct. 31, 2016, in the Korean Intellectual Property Office, which is incorporated herein by reference in its entirety.

BACKGROUND

1. Technical Field

Various embodiments generally relate to a semiconductor technology, and, more particularly, to a clock generation circuit, and a semiconductor device and system using the same.

2. Related Art

Electronic apparatuses such as computer systems may include a large number of electronic components. The computer system may include many semiconductor-based electronic components. These semiconductor devices may transmit and/or receive data signals in synchronization with clock signals. The data communication between the electronic components of the computer system may be either serial or parallel. In order to process a large amount of data in a short period of time, the semiconductor devices may receive serial data from another semiconductor device by using a serial communication, and then may convert the serial data into parallel data. Also, the semiconductor devices may convert the parallel data into serial data to output the data to another semiconductor device. That is to say, each of the semiconductor devices may include a serializer, which converts parallel data into serial data, to transmit data through a data bus using a serial communication method.

Generally speaking, the serializer has a configuration that sequentially outputs a plurality of data signals in synchronization with an edge of a clock signal. Since the current trend of computer systems and semiconductor devices is towards a high-speed operation, a high-speed system clock is used. In order to improve the accuracy of operations in the high-speed devices, a semiconductor device may generate multiphase clocks by dividing system clock frequencies. The semiconductor device may generate multiphase clocks that toggle in synchronization with the rising edge of the system clock, for a single data rate operation, and may generate multiphase clocks that toggle in synchronization with the rising edge and the falling edge of the system clock, for a double data rate operation.

SUMMARY

In an embodiment, a clock generation circuit may include a first clock generator and a second clock generator. The first clock generator may generate a first output clock which toggles in synchronization with a rising edge of a first input clock. The second clock generator may generate a second output clock, which has a level changing based on the first output clock, at a rising edge of a second input clock.

In an embodiment, a clock generation circuit may include a first divided clock generator, a second divided clock generator, and a first synchronizer. The first divided clock generator may generate a first divided clock based on a first input clock. The second divided clock generator may generate a second divided clock based on a second input clock and the first divided clock. The first synchronizer may generate a second output clock by synchronizing the second divided clock with the second input clock.

In an embodiment, a semiconductor device may include a clock buffer, a clock generation circuit, and a delay-locked loop circuit. The clock buffer may receive a clock and generate a first input clock and a second input clock. The clock generation circuit may generate a first output clock and a second output clock based on the first and second input clocks. The delay-locked loop circuit may generate a plurality of multiphase clocks based on the first and second output clocks. The clock generation circuit may include a first divided clock generator and a second divided clock generator. The first divided clock generator may generate a first divided clock based on the first input clock. The second divided clock generator may generate a second divided clock based on the second input clock and the first divided clock.

DETAILED DESCRIPTION

Hereinafter, a clock generation circuit, and a semiconductor device and system using the same will be described below with reference to the accompanying drawings through various examples of embodiments.

Figure 1:
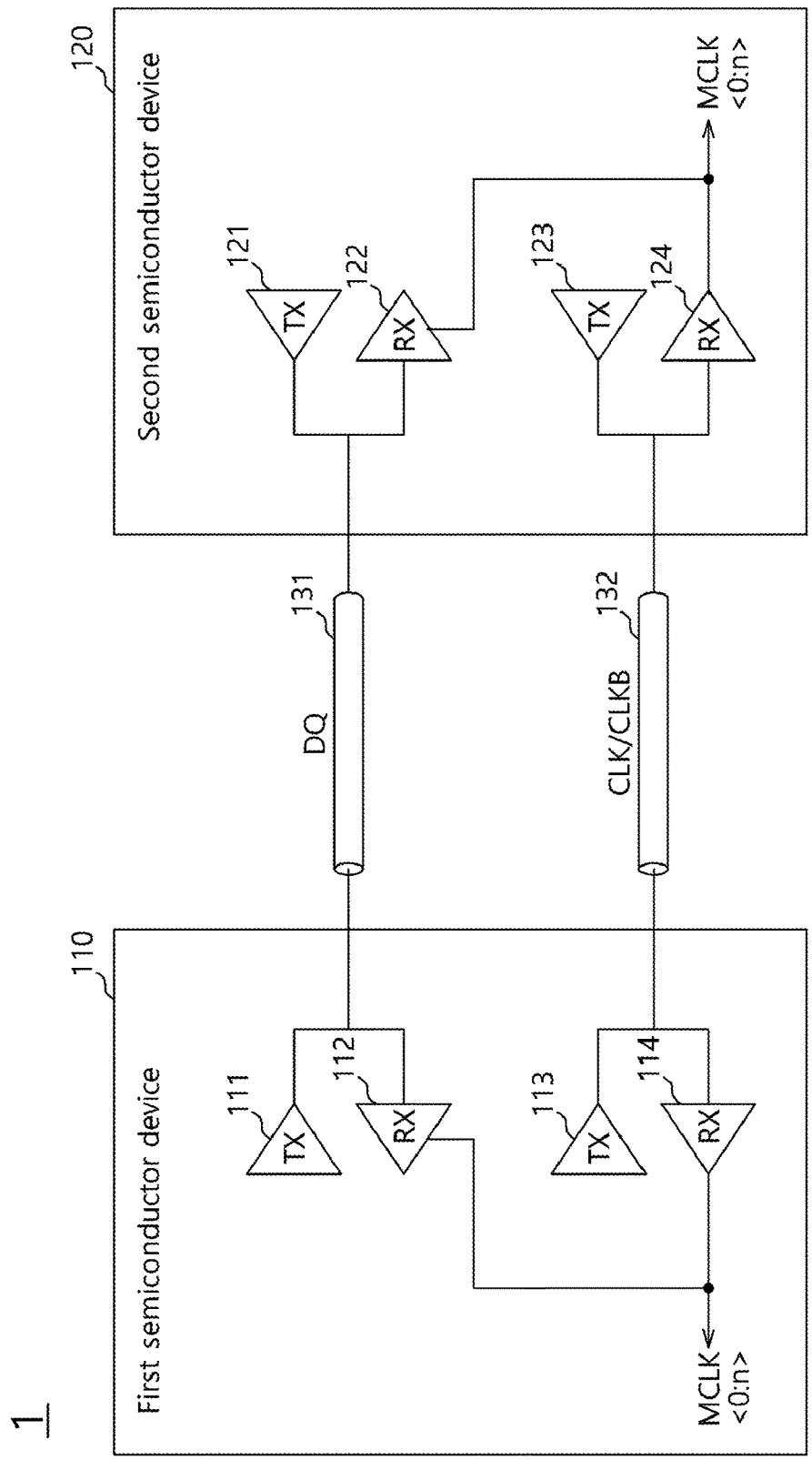
FIG. 1 is a diagram illustrating an example configuration of a system in accordance with an embodiment.

FIG. 1 is a diagram illustrating an example configuration of a system 1 in accordance with an embodiment. In FIG. 1, the system 1 may include a first semiconductor device 110 and a second semiconductor device 120. The first semiconductor device 110 and the second semiconductor device 120 may be electronic components that communicate with each other. In an embodiment, the first semiconductor device 110 may be a master device, and the second semiconductor device 120 may be a slave device, which operates under the control of the first semiconductor device 110. For example, the first semiconductor device 110 may be a host device. The first semiconductor device 110 may include a central processing unit (CPU), a graphic processing unit (GPU), a multimedia processor (MMP) or a digital signal processor (DSP). Also, the first semiconductor device 110 may be realized in the form of a system-on-chip (SOC) by combining processor chips having various functions, such as application processors (APs). The second semiconductor device 120 may be a memory. Here, examples of the memory may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The first and second semiconductor devices 110 and 120 may be coupled to each other through first and second signal transmission lines 131 and 132. The first and second signal transmission lines 131 and 132 may be channels, links, or buses. The first signal transmission line 131 may be a data transmission line or a data bus for transmitting data DQ. The second signal transmission line 132 may be a clock transmission line or a clock bus for transmitting a clock CLK/CLKB.

The first semiconductor device 110 may include a plurality of transmission circuits 111 and 113 and a plurality of reception circuits 112 and 114. The transmission circuit 111 may be a data transmission circuit. The transmission circuit 111 may transmit data DQ from the first semiconductor device 110 through the first signal transmission line 131 to the second semiconductor device 120. The reception circuit 112 may be a data reception circuit. The reception circuit 112 may receive data DQ transmitted through the first signal transmission line 131 from the second semiconductor device 120. The transmission circuit 113 may be a clock transmission circuit. The transmission circuit 113 may transmit a clock CLK/CLKB from the first semiconductor device 110 through the second signal transmission line 132 to the second semiconductor device 120. The clock CLK/CLKB may include an external clock, a system clock, or a data strobe signal. The reception circuit 114 may be a clock reception circuit. The reception circuit 114 may receive a clock CLK/CLKB transmitted through the second signal transmission line 132 from the second semiconductor device 120.

Similarly, the second semiconductor device 120 may include a plurality of transmission circuits 121 and 123 and a plurality of reception circuits 122 and 124. The transmission circuit 121 may be a data transmission circuit. The transmission circuit 121 may transmit data DQ from the second semiconductor device 120 through the first signal transmission line 131 to the first semiconductor device 110. The reception circuit 122 may be a data reception circuit. The reception circuit 122 may receive data DQ transmitted through the first signal transmission line 131 from the first semiconductor device 110. The transmission circuit 123 may be a clock transmission circuit. The transmission circuit 123 may transmit a clock CLK/CLKB from the second semiconductor device 120 through the second signal transmission line 132 to the first semiconductor device 110. The reception circuit 124 may be a clock reception circuit. The reception circuit 124 may receive a clock CLK/CLKB transmitted through the second signal transmission line 132 from the first semiconductor device 110.

The reception circuits 114 and 124 may generate multi-phase clocks MCLK<0:n> based on the clock CLK/CLKB transmitted through the second signal transmission line 132. The reception circuits 114 and 124 may provide the multiphase clocks MCLK<0:n> to the reception circuits 112 and 122. The reception circuits 112 and 122 may receive data DQ transmitted through the first signal transmission line 131, based on the multiphase clocks MCLK<0:n>.

Figure 2:
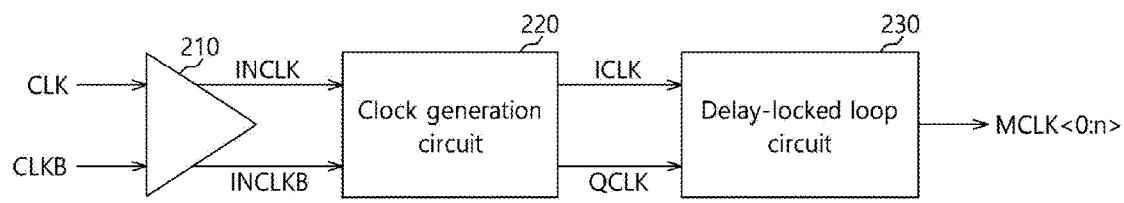
FIG. 2 is a diagram illustrating an example configuration of a semiconductor device in accordance with an embodiment.

FIG. 2 is a diagram illustrating an example configuration of a semiconductor device 200 in accordance with an embodiment. The concept of the semiconductor device 200 may be applied to the reception circuits 114 and 124 illustrated in FIG. 1. In FIG. 2, the semiconductor device 200 may receive clocks CLK and CLKB transmitted from an external device, and may generate a plurality of multiphase clocks MCLK<0:n> having different phases. The semiconductor device 200 may include a clock buffer 210, a clock generation circuit 220, and a delay-locked loop circuit 230. The clock buffer 210 may buffer the clocks CLK and CLKB transmitted from the external device, and may generate input clock signals INCLK and INCLKB. For example, the clocks CLK and CLKB transmitted from the external device may be external clocks or system clocks, and may be differential clocks. The clock buffer 210 may buffer the clock CLK and the complementary clock CLKB, and may generate a first input clock INCLK and a second input clock INCLKB. Like the clock CLK and the complementary clock CLKB, the first input clock INCLK and the second input clock INCLKB may be complementary clock signals. Accordingly, the first and second input clocks INCLK and INCLKB may have a 180-degree phase difference.

The clock generation circuit 220 may generate a first output clock ICLK and a second output clock QCLK based on the first and second input clocks INCLK and INCLKB. The clock generation circuit 220 may generate the first and second output clocks ICLK and QCLK by dividing the first and second input clocks INCLK and INCLKB. The first and second output clocks ICLK and QCLK may have a frequency lower than the first and second input clocks INCLK and INCLKB. For example, the first and second output clocks ICLK and QCLK may have a cycle length two times longer than the cycle of the first and second input clocks INCLK and INCLKB. The first and second output clocks ICLK and QCLK may have a phase difference, for example, a 90-degree phase difference. The first output clock ICLK may have a phase leading the phase of the second output clock QCLK.

The delay-locked loop circuit 230 may generate the plurality of multiphase clocks MCLK<0:n> based on the first and second output clocks ICLK and QCLK. The delay-locked loop circuit 230 may generate the plurality of multiphase clocks MCLK<0:n> having the same phase difference, based on the first and second output clocks ICLK and QCLK.

Figure 3:
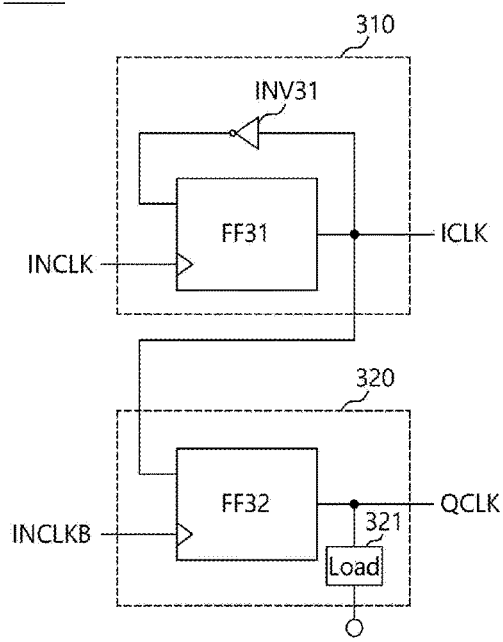
FIG. 3 is a diagram illustrating an example configuration of a clock generation circuit in accordance with an embodiment.

FIG. 3 is a diagram illustrating an example configuration of a clock generation circuit 300 in accordance with an embodiment. The concept of the clock generation circuit 300 may be applied to the clock generation circuit 220 illustrated in FIG. 2. In FIG. 3, the clock generation circuit 300 may receive a first input clock INCLK and a second input clock INCLKB, and may generate a first output clock ICLK and a second output clock QCLK. The clock generation circuit 300 may generate the first and second output clocks ICLK and QCLK by dividing the first and second input clocks INCLK and INCLKB. The first and second output clocks ICLK and QCLK may have a cycle length two times longer than the cycle length of the first and second input clocks INCLK and INCLKB. The first and second input clocks INCLK and INCLKB may have a 180-degree phase difference, and the first and second output clocks ICLK and QCLK may have a 90-degree phase difference.

The clock generation circuit 300 may include a first clock generator 310 and a second clock generator 320. The first clock generator 310 may generate the first output clock ICLK based on the first input clock INCLK. The first clock generator 310 may generate the first output clock ICLK toggling in synchronization with a rising edge of the first input clock INCLK. The first clock generator 310 may generate the first output clock ICLK which has a level changing based on the level of the first output clock ICLK, at the rising edge of the first input clock INCLK. Here, the term "level" may mean a pulse amplitude such as a voltage level of the clock signal. The second clock generator 320 may generate the second output clock QCLK based on the second input clock INCLKB and the first output clock ICLK. The second clock generator 320 may generate the second output clock QCLK which has a level changing based on the level of the first output clock ICLK, at a rising edge of the second input clock INCLKB.

In FIG. 3, the first clock generator 310 may include a first flip-flop FF31 and an inverter INV31. The first flip-flop FF31 may receive an input signal and generate the first output clock ICLK, which has a level changing based on the level of the input signal, at the rising edge of the first input clock INCLK. The first flip-flop FF31 may receive the first input clock INCLK through a clock terminal and receive the input signal through an input terminal, and may output the first output clock ICLK through an output terminal. The first flip-flop FF31 may output the input signal as the first output clock ICLK in synchronization with the rising edge of the first input clock INCLK. The inverter INV31 may invert the first output clock ICLK and generate the input signal. The inverter INV31 may provide the input signal to the first flip-flop FF31. The input signal may have a 180-degree phase difference compared to the first output clock ICLK. The input signal may be a complementary signal of the first output clock ICLK. The levels of the first output clock ICLK and the input signal may be changed at each rising edge of the first input clock INCLK. Therefore, the first flip-flop FF31 may generate the first output clock ICLK which has a level changing at each rising edge of the first input clock INCLK. In other words, the first flip-flop FF31 may generate the first output clock ICLK which toggles at each rising edge of the first input clock INCLK.

The second clock generator 320 may include a second flip-flop FF32. The second flip-flop FF32 may receive the first output clock ICLK and generate the second output clock QCLK, which has a level changing depending on the level of the first output clock ICLK, at the rising edge of the second input clock INCLKB. The second flip-flop FF32 may receive the second input clock INCLKB through a clock terminal and receive the first output clock ICLK through an input terminal, and may output the second output clock QCLK through an output terminal. The second flip-flop FF32 may output the first output clock ICLK as the second output clock QCLK in synchronization with the rising edge of the second input clock INCLKB. Since the second input clock INCLKB may have a frequency two times faster than the frequency of the first output clock ICLK, the second output clock QCLK may have a phase that lags behind the first output clock ICLK by 90 degrees. In the second clock generator 320, the second flip-flop FF32 may not receive an output signal thereof (i.e., the output signal of the second flip-flop FF32 is not fed back to an input terminal of the second flip-flop FF32), unlike the first flip-flop FF31 of the first clock generator 310. The second clock generator 320 may generate the second output clock QCLK based on the first output clock ICLK generated by the first clock generator 310. Thus, even when a noise or a glitch occurs in at least one of the first and second input clocks INCLK and INCLKB, the phase of the first output clock ICLK may always lead the phase of the second output clock QCLK.

In FIG. 3, the second clock generator 320 may further include a load 321. A point in time when the second output clock QCLK is generated may vary depending on the load 321. The load 321 may delay the second output clock QCLK. The load 321 may be provided to equalize times that are required to generate the first and second output clocks ICLK and QCLK. The first output clock ICLK may be generated by delaying the first input clock INCLK by the inverter INV31 and the first flip-flop FF31. Conversely, since the second output clock QCLK is generated by receiving the first output clock ICLK, the phase difference between the first and second output clock ICLK and QCLK may not be exactly 90 degrees. The load 321 may have an impedance value for delaying the second output clock QCLK such that a delay amount of the load 321 is determined based on a delay amount by the inverter INV31 and the first flip-flop FF31. For example, a delay time by the load 321 may correspond to the delay time by the first flip-flop FF31 and the inverter INV31. Therefore, the load 321 may perform phase control such that the first and second output clocks ICLK and QCLK have an exact 90-degree phase difference. For example, the load 321 may include a resistor element or a capacitor element. One end of the load 321 may be coupled to a node from which the second output clock QCLK is generated, and the other end of the load 321 may be floating.

Figure 4A:
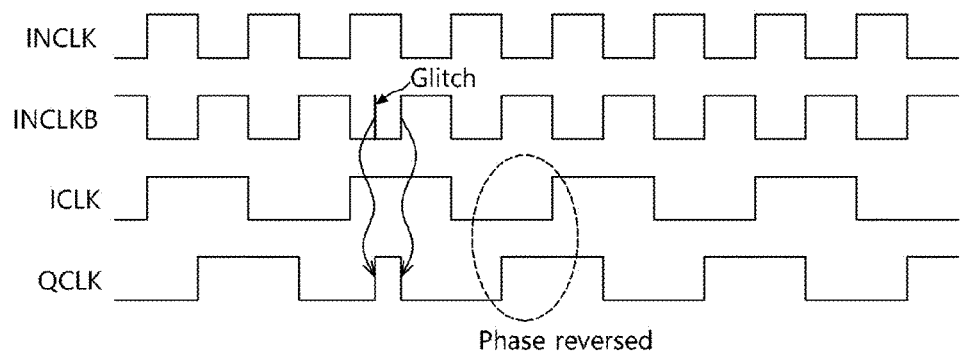
FIG. 4a is a representation of an example of a timing diagram provided to assist in the explanation of the operation of a clock generation circuit.
Figure 4B:
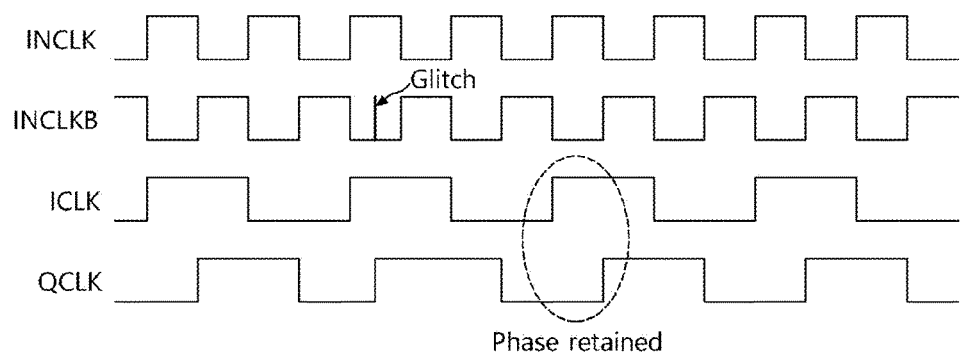
FIG. 4b is a representation of an example of a timing diagram provided to assist in the explanation of the operation of the clock generation circuit in accordance with an embodiment.

FIG. 4*a* is a representation of an example of a timing diagram provided to assist in the explanation of the operation of a clock generation circuit, and FIG. 4*b* is a representation of an example of a timing diagram provided to assist in the explanation of the operation of the clock generation circuit 300 illustrated in FIG. 3. An example of a clock generation circuit generates the first output clock ICLK from the first input clock INCLK, and generates the second output clock QCLK from the second input clock INCLKB. That is to say, the first and second output clocks ICLK and QCLK are generated independently of each other. Therefore, in the case where a noise or a glitch occurs in any one of the first and second input clocks INCLK and INCLKB, a malfunction in which the phases of the first and second output clocks ICLK and QCLK are reversed may be caused. For example, in the case where a glitch occurs in the second input clock INCLKB as shown in FIG. 4*a*, the phase of the second output clock QCLK may be changed at an unexpected point in time and end up leading the phase of the first output clock ICLK.

In the clock generation circuit 300 in accordance with an embodiment, by generating the second output clock QCLK based on the first output clock ICLK, the malfunction as shown in FIG. 4*a* may be prevented. In FIG. 4*b*, when a glitch occurs in the second input clock INCLKB, since the first output clock ICLK is at a high level, the second clock generator 320 may turn the second output clock QCLK into a high level. At the next rising edge of the second input clock INCLKB, since the first output clock ICLK is still at the high level, the second clock generator 320 may not change the level of the second output clock QCLK. Thus, the second output clock QCLK may be at the high level until the next rising edge of the second input clock INCLKB, and the phase of the first output clock ICLK may still lead the phase of the second output clock QCLK).

Figure 5:
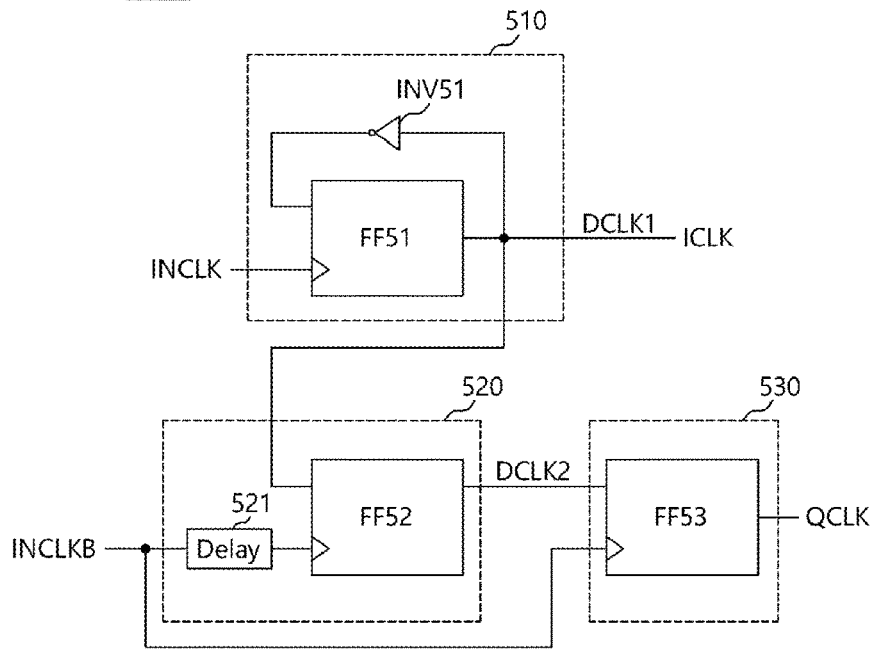
FIG. 5 is a diagram illustrating an example configuration of a clock generation circuit in accordance with an embodiment.

FIG. 5 is a diagram illustrating an example configuration of a clock generation circuit 500 in accordance with an embodiment. In FIG. 5, the clock generation circuit 500 may include a first divided clock generator 510, a second divided clock generator 520, and a synchronizer 530. The first divided clock generator 510 may generate a first divided clock DCLK1 based on a first input clock INCLK. The first divided clock DCLK1 may be provided as a first output clock ICLK. The first divided clock DCLK1 may be fed back to an input terminal of the first divided clock generator 510, and the first divided clock generator 510 generate the first output clock ICLK based on the first input clock INCLK and the fed-back first divided clock DCLK1. The first divided clock generator 510 may generate the first output clock ICLK which toggles at each rising edge of the first input clock INCLK. The first divided clock generator 510 may change the level of the first divided clock DCLK1 depending on the level of the first divided clock DCLK1 at the rising edge of the first input clock INCLK.

The second divided clock generator 520 may generate a second divided clock DCLK2 based on a second input clock INCLKB and the first divided clock DCLK1. The first and second input clocks INCLK and INCLKB may have a 180-degree phase difference. The first and second divided clocks DCLK1 and DCLK2 may have a cycle length two times longer than the cycle of the first and second input clocks INCLK and INCLKB. The first and second divided clocks DCLK1 and DCLK2 may have a 90-degree phase difference. The second divided clock generator 520 may generate the second divided clock DCLK2 which toggles at each rising edge of the second input clock INCLKB. The second divided clock generator 520 may change the level of the second divided clock DCLK2 depending on the level of the first divided clock DCLK1 at the rising edge of the second input clock INCLKB.

The synchronizer 530 may generate a second output clock QCLK based on the second input clock INCLKB and the second divided clock DCLK2. The synchronizer 530 may output the second output clock QCLK by synchronizing the second divided clock DCLK2 with the second input clock INCLKB. The synchronizer 530 may retime the second divided clock DCLK2 based on the second input clock INCLKB such that the first output clock ICLK and the second output clock QCLK have a 90-degree phase difference. The synchronizer 530 may be a circuit that is used in place of the load 321 shown in FIG. 3.

In FIG. 5, the divided clock generator 510 may include a first flip-flop FF51 and an inverter INV51. The first flip-flop FF51 may receive the first input clock INCLK through a clock terminal and receive an input signal through an input terminal, and may output the first divided clock DCLK1 through an output terminal. The first flip-flop FF51 may output the input signal as the first divided clock DCLK1 in synchronization with the rising edge of the first input clock INCLK. The inverter INV51 may invert the first divided clock DCLK1 and generate the input signal. Since the first divided clock DCLK1 is inverted by the inverter INV51 and then is provided to the first flip-flop FF51, the first divided clock generator 510 may generate the first divided clock DCLK1 which toggles at each rising edge of the first input clock INCLK.

The second divided clock generator 520 may include a second flip-flop FF52. The second flip-flop FF52 may receive the second input clock INCLKB through a clock terminal and receive the first divided clock DCLK1 through an input terminal, and may output the second divided clock DCLK2 through an output terminal. The second flip-flop FF52 may output the first divided clock DCLK1 as the second divided clock DCLK2 in synchronization with the rising edge of the second input clock INCLKB. Accordingly, the second divided clock generator 520 may generate the second divided clock DCLK2 which has a level changing depending on the level of the first divided clock DCLK1, at the rising edge of the second input clock INCLKB. The second divided clock generator 520 may further include a delay 521. The delay 521 may delay the second input clock INCLKB input to the second flip-flop FF52. A point in time when the second divided clock DCLK2 is generated may vary depending on the delay 521.

The synchronizer 530 may include a third flip-flop FF53. The third flip-flop FF53 may receive the second input clock INCLKB through a clock terminal and receive the second divided clock DCLK2 through an input terminal, and may output the second output clock QCLK through an output terminal. The third flip-flop FF53 may output the second divided clock DCLK2 as the second output clock QCLK in synchronization with the rising edge of the second input clock INCLKB. The third flip-flop FF53 may generate the second output clock QCLK which has a level changing depending on the level of the second divided clock DCLK2, at the rising edge of the second input clock INCLKB. The third flip-flop FF53 may generate the second output clock QCLK, by retiming the second divided clock DCLK2 generated by the second flip-flop FF52 based on the phase of the second input clock INCLKB. The synchronizer 530 may compensate for a phase difference of the first and second output clocks ICLK and QCLK that may be caused by structural asymmetry of the second divided clock generator 520 and the first divided clock generator 510.

Figure 6:
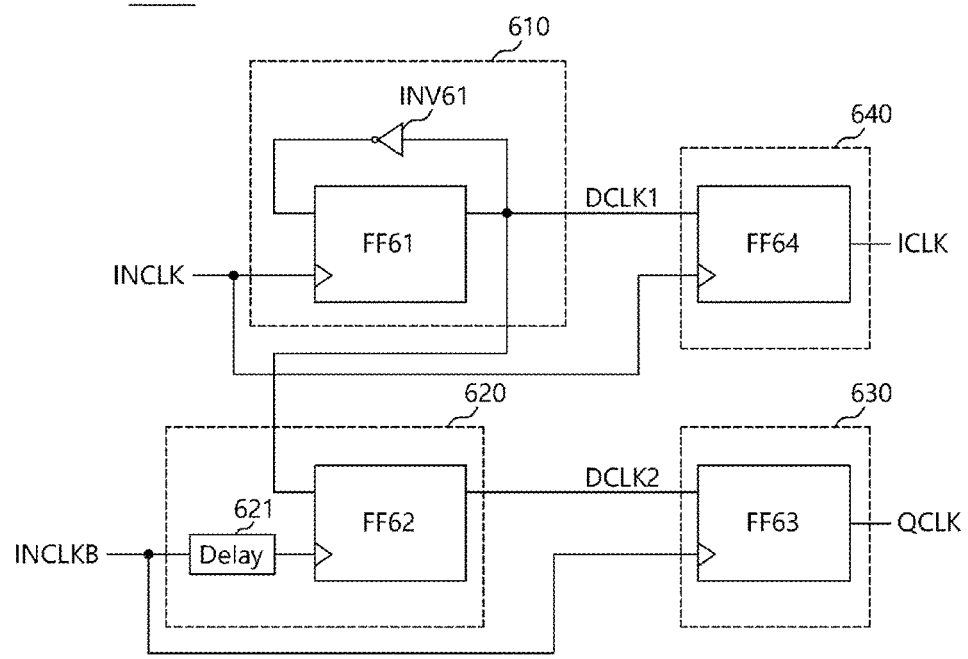
FIG. 6 is a diagram illustrating an example configuration of a clock generation circuit in accordance with an embodiment.

FIG. 6 is a diagram illustrating an example configuration of a clock generation circuit 600 in accordance with an embodiment. In FIG. 6, the clock generation circuit 600 may include a first divided clock generator 610, a second divided clock generator 620, a first synchronizer 630, and a second synchronizer 640. The first divided clock generator 610 may receive a first input clock INCLK and a first divided clock DCLK1, which is fed back from an output terminal of the first divided clock generator 610, and may generate the first divided clock DCLK1. The first divided clock generator 610 may include a first flip-flop FF61. The first divided clock generator 610 may have substantially the same configuration and perform substantially the same function as the first divided clock generator 510 shown in FIG. 5. The second divided clock generator 620 may receive a second input clock INCLKB and the first divided clock DCLK1, and may generate a second divided clock DCLK2. The second divided clock generator 620 may include a second flip-flop FF62 and a delay 621. The second divided clock generator 620 may have substantially the same configuration and perform substantially the same function as the second divided clock generator 520 shown in FIG. 5. The first synchronizer 630 may receive the second input clock INCLKB and the second divided clock DCLK2, and may generate a second output clock QCLK. The first synchronizer 630 may include a third flip-flop FF63. The first synchronizer 630 may have substantially the same configuration and perform substantially the same function as the synchronizer 530 shown in FIG. 5.

The second synchronizer 640 may generate a first output clock ICLK based on the first input clock INCLK and the first divided clock DCLK1. The second synchronizer 640 may output the first output clock ICLK by synchronizing the first divided clock DCLK1 with the first input clock INCLK. The second synchronizer 640 may retime the first divided clock DCLK1 based on the first input clock INCLK. The second synchronizer 640 may control a point in time when the first output clock ICLK is generated, in cooperation with the first synchronizer 630, such that the first output clock ICLK and the second output clock QCLK have an exact 90-degree phase difference. The second synchronizer 640 may include a fourth flip-flop FF64. The fourth flip-flop FF64 may receive the first input clock INCLK through a clock terminal and receive the first divided clock DCLK1 through an input terminal, and may output the first output clock ICLK through an output terminal. The fourth flip-flop FF64 may output the first divided clock DCLK1 as the first output clock ICLK in synchronization with the rising edge of the first input clock INCLK. The fourth flip-flop FF64 may generate the first output clock ICLK, which has a level changing depending on the level of the first divided clock DCLK1, at the rising edge of the first input clock INCLK.

While various embodiments have been described above, it will be understood to those skilled in the art that the embodiments described are examples only. Accordingly, the clock generation circuit, and the semiconductor device and system using the same described herein should not be limited based on the described embodiments.

What is claimed is:

1. A clock generation circuit comprising:
   a first clock generator configured to generate a first output clock which toggles in synchronization with a rising edge of a first input clock;
   a second clock generator configured to generate a second output clock, which has a level changing based on the first output clock, at a rising edge of a second input clock; and
   a load configured to delay the second output clock by a delay time corresponding to a delay time occurred by the first clock generator.

2. The clock generation circuit according to claim 1, wherein the first input clock has a 180-degree phase difference compared to the second input clock, and the first output clock has a 90-degree phase difference compared to the second output clock.

3. The clock generation circuit according to claim 1, wherein the first clock generator comprises:
   a first flip-flop configured to output an input signal as the first output clock at a rising edge of the first input clock; and
   an inverter configured to provide the input signal by inverting the first output clock.

4. The clock generation circuit according to claim 3, wherein the second clock generator comprises:
   a second flip-flop configured to output the first output clock as the second output clock at a rising edge of the second input clock.

5. The clock generation circuit according to claim 4, wherein the delay time added by the load corresponds to a delay time added by the first flip-flop and the inverter.

6. A clock generation circuit comprising:
   a first divided clock generator configured to generate a first divided clock based on a first input clock;
   a second divided clock generator configured to generate a second divided clock based on a second input clock and the first divided clock; and
   a first synchronizer configured to generate a second output clock by synchronizing the second divided clock with the second input clock.

7. The clock generation circuit according to claim 6, wherein the first input clock has a 180-degree phase difference compared to the second input clock, and the first divided clock has a 90-degree phase difference compared to the second divided clock.

8. The clock generation circuit according to claim 6, wherein the first divided clock generator comprises:
   a first flip-flop configured to output an input signal as the first divided clock in synchronization with a rising edge of the first input clock; and
   an inverter configured to invert the first divided clock and then provide the inverted first divided clock as the input signal.

9. The clock generation circuit according to claim 8, wherein the second divided clock generator comprises a second flip-flop configured to output the first divided clock as the second divided clock in synchronization with a rising edge of the second input clock.

10. The clock generation circuit according to claim 9, wherein the second divided clock generator further comprises a delay configured to delay the second input clock and then provide the delayed second input clock to the second flip-flop.

11. The clock generation circuit according to claim 9, wherein the first synchronizer comprises a third flip-flop configured to output the second divided clock as the second output clock in synchronization with a rising edge of the second input clock.

12. The clock generation circuit according to claim 11, further comprising a second synchronizer configured to generate a first output clock by synchronizing the first divided clock with the first input clock.

13. The clock generation circuit according to claim 12, wherein the second synchronizer comprises a fourth flip-flop configured to output the first divided clock as the first output clock in synchronization with a rising edge of the first input clock.

14. A semiconductor device comprising:
   a clock buffer configured to receive a clock and generate a first input clock and a second input clock;
   a clock generation circuit configured to generate a first output clock and a second output clock based on the first and second input clocks; and
   a delay-locked loop circuit configured to generate a plurality of multiphase clocks based on the first and second output clocks, the clock generation circuit comprising:
   a first divided clock generator configured to generate a first divided clock based on the first input clock;
   a second divided clock generator configured to generate a second divided clock based on the second input clock and the first divided clock; and
   a first synchronizer configured to generate the second output clock by synchronizing the second divided clock with the second input clock.

15. The semiconductor device according to claim 14, wherein the first divided clock generator comprises:
   a first flip-flop configured to generate the first divided clock, which has a level changing depending on a level of an input signal, in synchronization with a rising edge of the first input clock; and
   an inverter configured to invert the first divided clock and then provide the inverted first divided clock as the input signal.

16. The semiconductor device according to claim 14, wherein the second divided clock generator comprises a second flip-flop configured to generate the second divided clock, which has a level changing depending on a level of the first divided clock, in synchronization with a rising edge of the second input clock.

17. The semiconductor device according to claim 16, wherein the first synchronizer comprises a third flip-flop configured to generate the second output clock, which has a level changing depending on a level of the second divided clock, in synchronization with a rising edge of the second input clock.

18. The semiconductor device according to claim 17, wherein the clock generation circuit further comprises a second synchronizer configured to generate the first output clock by synchronizing the first divided clock with the first input clock.

19. The semiconductor device according to claim 18, wherein the second synchronizer comprises a fourth flip-flop configured to generate the first output clock which has a level changing depending on a level of the first divided clock, in synchronization with a rising edge of the first input clock.

* * * * *